(12) United States Patent
Trask

(10) Patent No.: US 11,949,266 B2
(45) Date of Patent: Apr. 2, 2024

(54) MOBILE POWERED DEVICE STAND

(71) Applicant: Keone Trask, Greenville, SC (US)

(72) Inventor: Keone Trask, Greenville, SC (US)

( * ) Notice: Subject to any disclaimer, the term of this patent is extended or adjusted under 35 U.S.C. 154(b) by 155 days.

(21) Appl. No.: 17/480,927

(22) Filed: Sep. 21, 2021

(65) Prior Publication Data

US 2022/0109313 A1 Apr. 7, 2022

Related U.S. Application Data

(60) Provisional application No. 63/088,727, filed on Oct. 7, 2020.

(51) Int. Cl.
*H02J 7/00* (2006.01)
*H05K 5/02* (2006.01)

(52) U.S. Cl.
CPC .......... *H02J 7/0045* (2013.01); *H02J 7/0042* (2013.01); *H02J 7/0048* (2020.01); *H05K 5/0234* (2013.01); *H02J 7/0047* (2013.01)

(58) Field of Classification Search
CPC ...... H02J 7/0042; H02J 7/0044; H02J 7/0045; H02J 7/0047; H02J 7/0048; H05K 5/0234; B62B 5/00; B62B 3/02
USPC ......................................... 320/107, 111, 113
See application file for complete search history.

(56) References Cited

U.S. PATENT DOCUMENTS

| | | | |
|---|---|---|---|
| 2009/0212848 A1* | 8/2009 | Coonan | H02J 7/0013 320/127 |
| 2014/0152099 A1* | 6/2014 | Boyd | H02J 7/0013 320/134 |
| 2014/0344610 A1* | 11/2014 | Ross | H02J 4/00 713/340 |
| 2016/0344138 A1* | 11/2016 | Kazmier | H02J 7/00 |
| 2018/0233948 A1* | 8/2018 | Destenaves | G06F 1/1635 |
| 2019/0270471 A1* | 9/2019 | Hazzard | B62B 3/02 |
| 2020/0305805 A1* | 10/2020 | Freeman | A61B 5/002 |
| 2022/0236940 A1* | 7/2022 | Adsett | G09F 9/33 |

* cited by examiner

*Primary Examiner* — Edward Tso
*Assistant Examiner* — Aaron Piggush
(74) *Attorney, Agent, or Firm* — John R. Perkins, Jr.; Perkins Law Firm

(57) ABSTRACT

The present invention generally relates to a powered mobile display device stand for use in locations without available or reliable electrical power. A plate designed to hold a display device is attached to an articulating neck. The neck is affixed to a mobile base containing therein a battery, inverter, charger, power input and power output. The plate may articulate to adjust viewing angle of the display device. And the neck may articulate to adjust the viewing height of the display device. The battery may be sized to provide power to the display device, as well as additional peripherals. Computer software is optionally included to control and monitor all functionality of the system using a display device such as a touchscreen monitor.

13 Claims, 4 Drawing Sheets

MOBILE POWERED DEVICE STAND

CROSS-REFERENCE TO RELATED APPLICATIONS

This application claims priority to U.S. Provisional Patent Application No. 63/088,727 filed Oct. 7, 2020 which is incorporated herein by reference.

The prevent invention generally relates to systems and methods of providing mobile device stands and, more particularly, to a mobile powered device stand designed to allow complete mobility in an articulating stand that provides its own power for use in locations without available or reliable electrical power.

BACKGROUND OF THE INVENTION

Educational institutions have transitioned over the past two generations away from chalk hoard use, first to marker boards and now to touchscreens. In most cases, a classroom has plenty of electrical receptacles so it is not generally necessary to provide a power source for touchscreens. In some cases, however, power is not readily available and not always reliable. In those situations, an independent power source is necessary to use a touchscreen.

If a classroom, boardroom, or other area is without electrical receptacles, or reliable power, a touchscreen user must either (1) retrieve and connect a power cord and run it all the way from another room to the room where the touchscreen is used, or (2) forego use of the touchscreen. A system and method that provides a touchscreen stand, which provides its own power, would prevent these problems.

Current display device carts and stands operate on the same principles that they have for generations. They provide a cart designed to hold a TV or monitor with wheels on the bottom of the cart. Power must be available in the location where the TV is to be used. In addition, prior art TV carts generally do not offer adjustability for use in different environments. More specifically, prior art systems do not allow for adjustable heights and angles for viewing a monitor.

Prior art solutions also tail to preside additional power for additional devices that need to be used in conjunction with the monitor. For example, even if a powered cart were available, it would still have to provide additions power to a laptop or other ancillary device that connects to the monitor. Otherwise, the monitor would be the only device powered. In other words, prior an solutions have not provided a solution to these issues sufficient for using a touchscreen monitor in some situations and in some locations.

What is needed is a touchscreen stand that provides an independent, reliable power source so that the display device can be operated even where electrical power is unavailable or unreliable A system and method that provides independent, reliable power would allow continuous use of a display device if the solution were portable with the display device.

What is further needed is a display device stand that articulates on multiple axes to provide variable height and viewing angle adjustment.

What is also needed is a display device stand that provides power, not only for the display device, but also for peripheral devices needed in conjunction with the display device.

An object of the present invention is to provide a mobile display device stand with an independent, reliable power supply so as to power the touchscreen when electrical power is unavailable or unreliable in a specific location or condition.

Another object of the present invention is to provide a mobile display device stand with an independent, reliable power supply so as to power additional peripherals when electrical power is unavailable or unreliable in a specific location or condition.

Yet another object of the present invention is to provide a mobile device display stand capable of height and viewing angle adjustment.

SUMMARY OF THE INVENTION

The present invention accomplishes the foregoing objects by providing a mobile display device stand that contains a charger, battery and inverter housed within a stable mobile stand.

The present invention further accomplishes the foregoing objects by providing a powered mobile display device stand, comprising: a base, comprising: a base cover, a multiplicity of wheels affixed to the bottom of said base so as to provide mobility for said base, a communications port and cable for accepting input from a peripheral device and providing said input to a display device; a housing, wherein a power supply is disposed, said power supply comprising: a battery, an inverter, a charger, a power outlet for providing power, and a power inlet for charging said battery, an adjustable neck affixed to the top of said base and extending vertically upward therefrom, and a substantially flat plate affixed to the top of said adjustable neck for attaching a display device.

The present invention accomplishes the foregoing objects by further providing another embodiment, wherein said substantially flat plate is affixed to said adjustable neck by means of an articulating hinge so as to allow an adjustable viewing angle for said display device.

The present invention accomplishes the foregoing objects by further providing another embodiment, wherein said adjustable neck articulates upwards and downwards so as to allow an adjustable viewing height for said display device.

The present invention accomplices the foregoing objects by further providing another embodiment, further comprising a processor adapted to monitor said batters so as to provide a display output indicating a status of said battery.

The present invention accomplishes the foregoing objects by further providing another embodiment, further comprising an additional said power outlet for providing power to a peripheral device.

The present invention accomplishes the foregoing objects by further providing another embodiment, wherein said power outlet for providing power is a non-standard power outlet so as to prevent unwanted use of the system.

The present invention accomplishes the foregoing objects by providing a powered mobile display device stand, comprising: a housing comprising therein: a communications port and cable for accepting input from a peripheral dev ice and providing said input to a display device, a power supply comprising: a battery, an inverter, a charger, a power outlet for providing power, and a power inlet for charging said battery, an adjustable neck affixed to the top of said housing and extending vertically upward therefrom, and a substantially flat plate affixed to the top of said adjustable neck for attaching a display device.

The present invention accomplishes the foregoing objects by providing a method of using a powered mobile display device stand comprising the steps of: providing a housing comprising therein: a communications port and cable for communicating between a peripheral device and a display device, a power supply comprising: a battery, an inverter, a charger, a power outlet for providing power, and a power inlet for charging said battery: providing an adjustable neck affixed to the top of said housing and extending vertically upward therefrom; providing a substantially flat plate affixed to the top of said adjustable neck for attaching a display device; and attaching a display device to said substantially flat plate.

The present invention accomplishes the foregoing objects by providing a method, wherein said substantially Oat plate is affixed to said adjustable neck by means of an articulating hinge so as to allow an adjustable viewing angle for said display device.

The present invention accomplishes the foregoing objects by providing a method, wherein said adjustable neck articulates upwards and downwards so as to allow an adjustable viewing height for said display device.

The present invention accomplishes the foregoing objects by providing a method, wherein said housing further comprises a processor adapted to monitor said battery so as to provide a display output indicating a status of said battery.

The present invention accomplishes the foregoing objects by providing a method, wherein said housing further comprises an additional said power outlet for providing power to a peripheral device.

The present invention accomplishes the foregoing objects by providing a method, wherein said power outlet for providing power is a non-standard power outlet so as to prevent unwanted use of the system.

The present invention accomplishes the foregoing objects by providing a powered device stand, comprising a housing, comprising therein a power supply, comprising: a battery, an inverter, a charger, a power outlet for providing power, and a power inlet for charging said battery.

The present invention accomplishes the foregoing objects by providing a powered device stand, comprising a non-transitory computer readable medium encoded with a computer program comprising instructions that when executed by one or more processors cause the one or more processors to perform operations comprising: providing status information of one of a multiplicity of controllable parameters in a powered device stand, comprising a housing, comprising therein a power supply, comprising: a battery, an inverter, a charger, a power outlet for providing power, and a power inlet for charging said battery.

DESCRIPTION OF THE DRAWINGS

The invention will be more readily understood with reference to the following specification in conjunction with the drawings herein.

DESCRIPTION OF THE PREFERRED EMBODIMENTS

Figure 1:
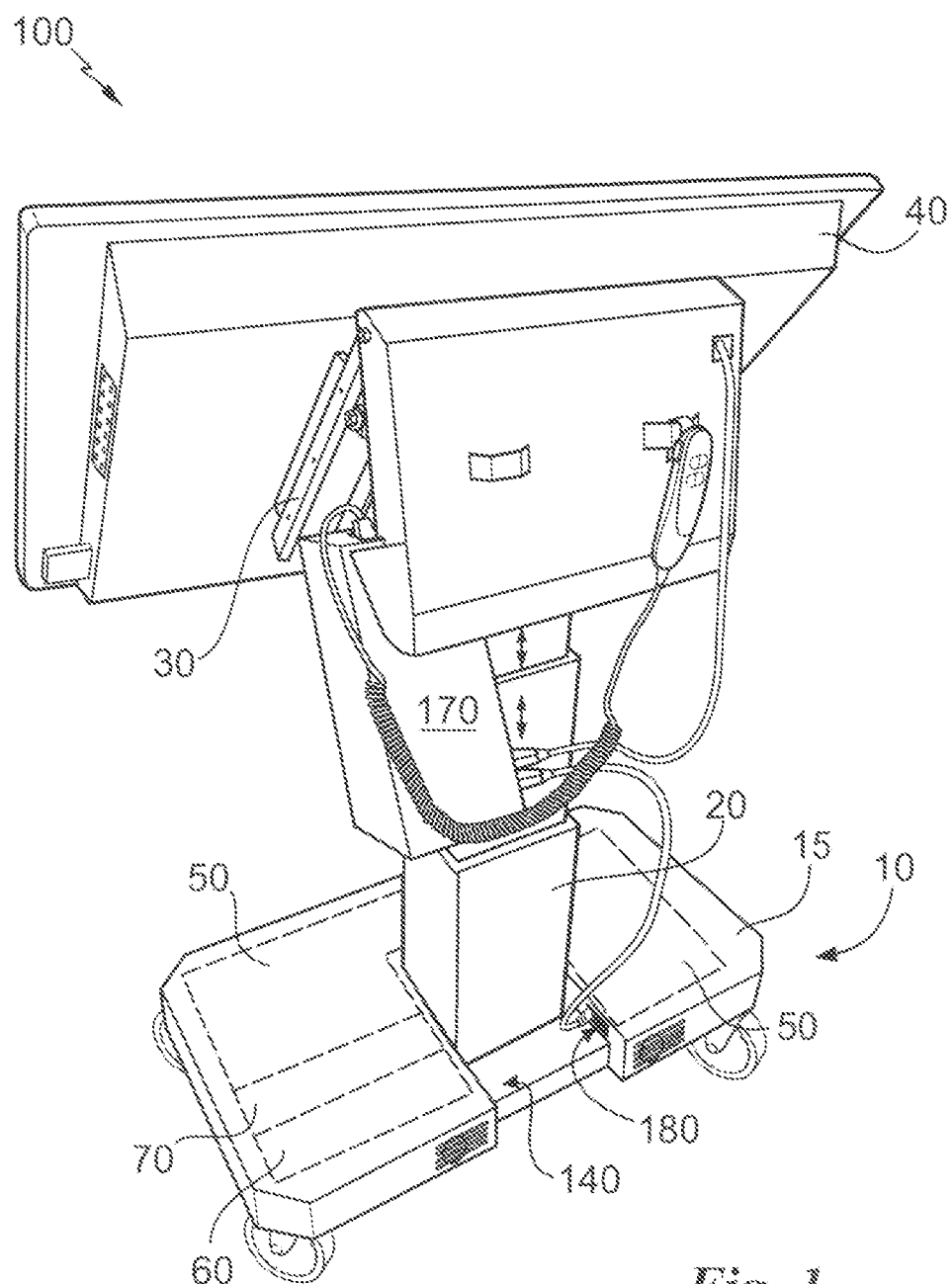
FIG. 1 is a rear perspective view of a mobile powered display device stand system according to a preferred embodiment of the invention.

Referring now to FIG. 1, a perspective view of a system 100 is provided fora mobile powered display device stand system according to a preferred embodiment of the invention. A base 10 is provided with a base cover 15 as pictured. Contained within the base are a battery 50, inverter 60, charger 70, electrical output 180 and electrical input 140.

Multiple reasons exist for placing all these items inside the base 10 and under cover 15. First, batteries, chargers, and inverters tend to be heavy, so placing them in base 10 moves the center of gravity for system 100 very low to the ground. This makes the device far more stable than it would be otherwise.

Second, this is the roost logical piece to create a reinforced case, shown here as 15. One of the target customers for this device is educational institutions. That means that students can reasonably be expected to climb on base 10 from time to time. As such, base 10 further includes significant reinforcements within to withstand crushing forces from a person standing on its surface. A reinforced case 15 is also a better place to put heavy items such as batteries, chargers, and inverters so that they are more secure.

Third, a simple base cover is easy to remove in situations where a customer wants to access the battery to add or subtract cells. A preferred embodiment of the invention includes a battery with 4 Li ion cells but is easily upgraded to 8 cells when needed.

In normal use, battery 50 is charged by charger 70 when base 10 is plugged into a standard receptacle using a cable (not pictured) attached to power input 140. When battery 50 is charged, power is output through power output 180. In this instance, display device 40 is plugged into power output 180, along with the controller 170 for articulating neck 20. Inverter 60 transfers the DC power from battery 50 and converts it into AC power to output to power output 180.

As pictured, buttery 50 takes up approximately 80% of the available space within base 10. Different sizes and types of batteries may be employed for different uses. Testing has shown that up to 12 hours of power is readily available for a 65" touchscreen, where a series of cells in a Li ion battery is enclosed within base 10 with a width of approximately 48" depth of approximately 24" and height of approximately 4". As this is a more expensive configuration, smaller and cheaper batteries may be employed for different pricing structures and applications.

An articulating neck 20 is attached to the top of base 10 and extends upwards. A substantially flat plate 30 is affixed to the top of articulating neck 20. Plate 30 is designed to accept a display device 40 such as the monitor pictured in FIG. 1. In one embodiment, neck 20 is connected to plate 30 with an articulating hinge so as to allow a user to adjust the viewing angle of display device 40. In a preferred embodiment neck 20 also articulates upwards and downwards to provide height adjustment for display device 40.

Figure 2:
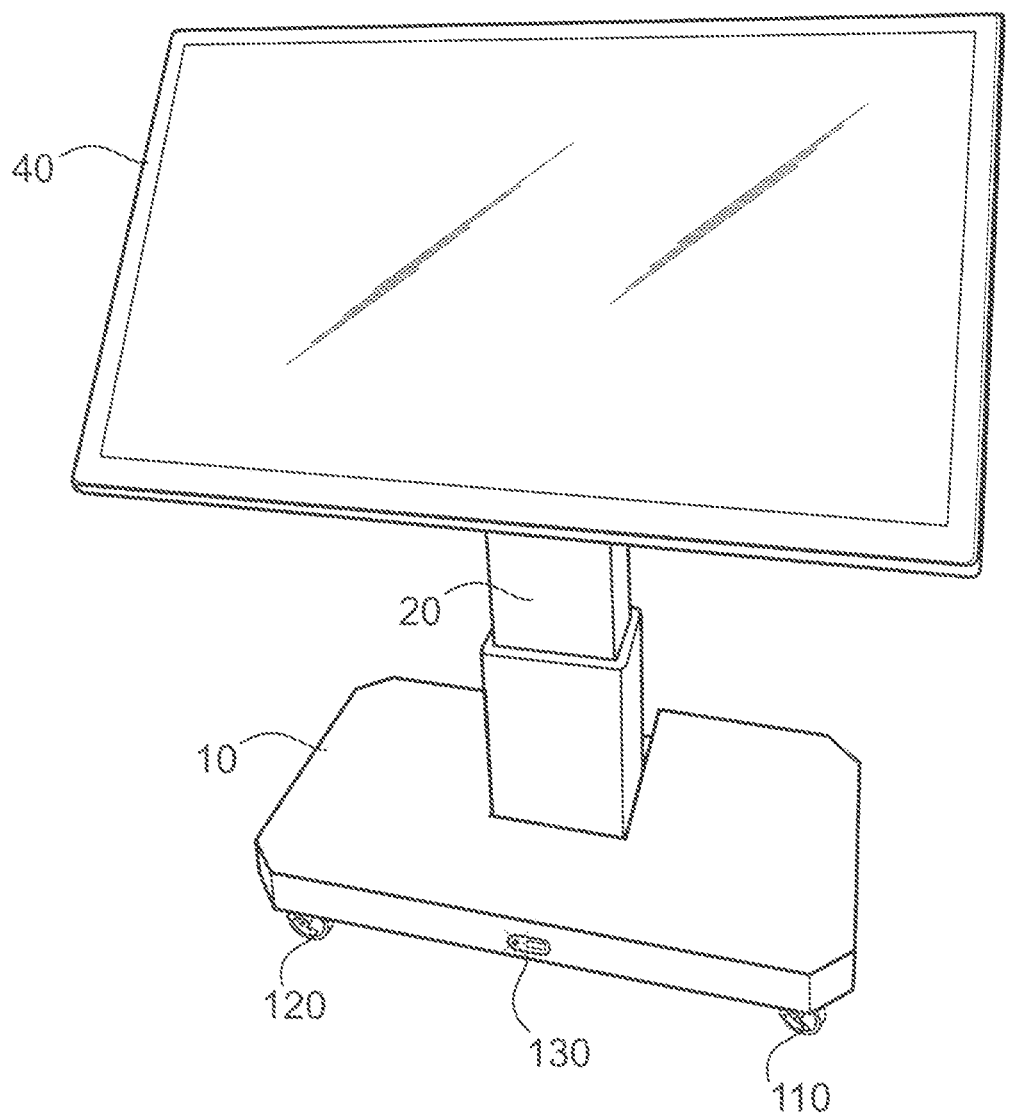
FIG. 2 is a front perspective view of a mobile powered display device stand system according to a preferred embodiment of the invention.

Referring now to FIG. 2, the mobile powered display device stand system is displayed from the front angle. Display device 40 is pictured, along with neck 20 and base 10. Optional casters 110 may be added to the base for increased mobility. A preferred embodiment includes locking casters 120. An additional embodiment includes a battery status indicator 130.

Figure 3:
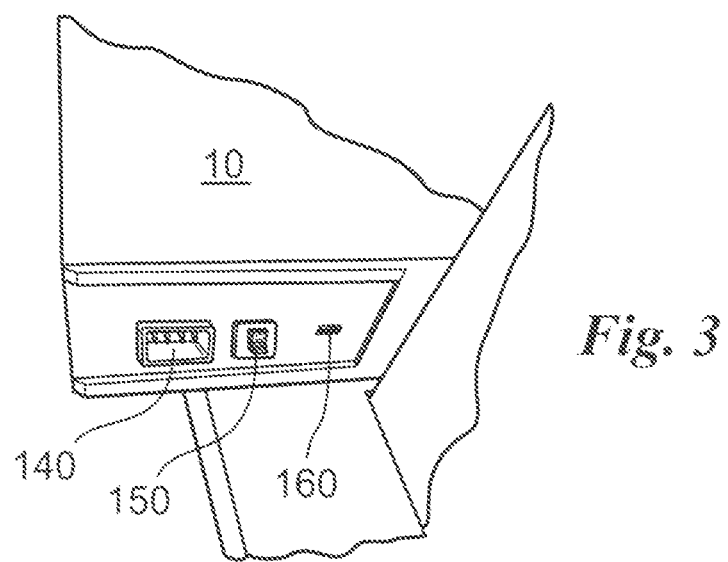
FIG. 3 is a view of a portion of the base in a mobile powered display device stand system according to a preferred embodiment of the invention.

Referring now to FIG. 3, a portion of the base 10 of a mobile powered display device stand system is shown in closer perspective. A power input 140 is pictured. This input accepts a standard power cable to charge the battery within base 10. A circuit breaker 150 is preferably added. Communications port 160 provides a pathway to connect a peripheral device (not pictured) to a display device.

Figure 4:
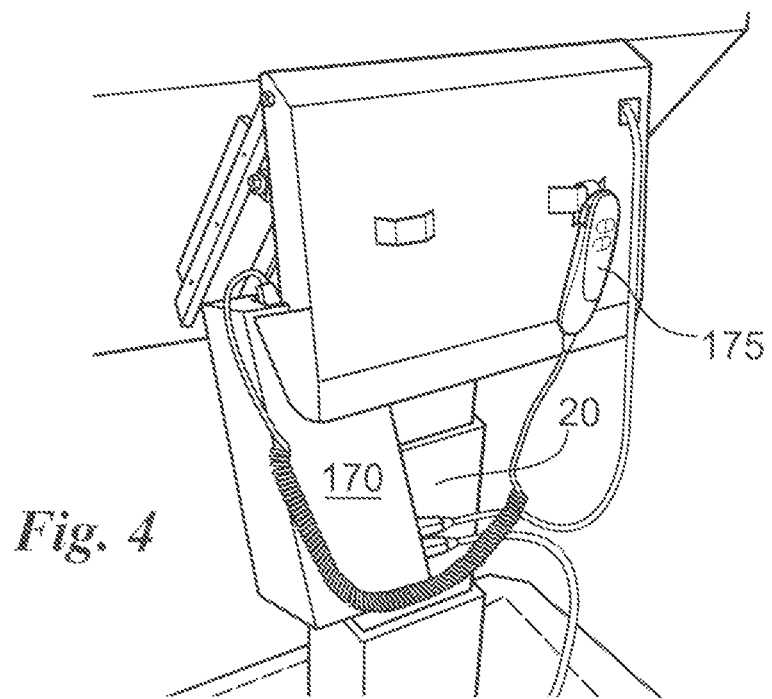
FIG. 4 is a view of the articulating neck in a mobile powered display device stand system according to a preferred embodiment of the invention.

Referring now to FIG. 4, neck articulation controller 170 is pictured for providing a system for controlling the articulation of neck 20. Hand held controller 170 contains the controls for moving neck 20 up and down and tilting.

Figure 5:
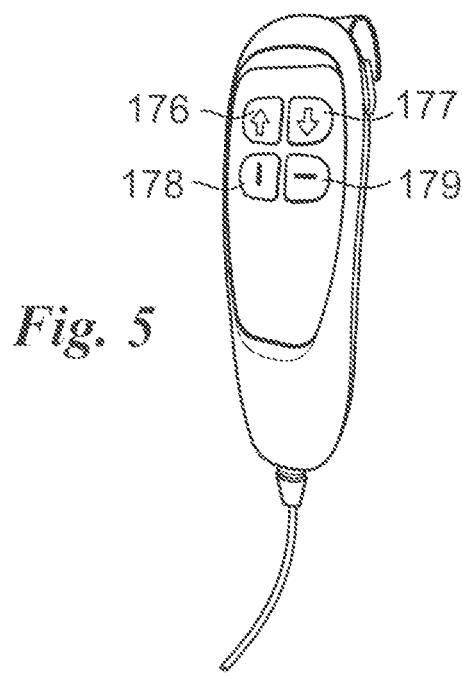
FIG. 5 is a view of the controls attached to the Hat plate attached to the articulating neck in a mobile powered display device stand system according to a preferred embodiment of the invention.

As shown in FIG. 5, four buttons can easily control all articulation of the system Upward button 176 moves neck 20 upward, where downward button 177 moves neck 20 downward Vertical button 178 tilts the viewing angle of display device more towards a vertical position, whereas button 179 tilts the viewing angle of the display device more towards the horizontal position. The embodiment of controller 170 as pictured is a wired configuration but is easily implemented in a wireless configuration.

In another embodiment of the invention, the display device includes software that allows a user to perform multiple functions using touchscreen commands on the display device. More specifically, the software provides user control of a multiplicity of controllable parameters in a powered device stand 100 using a display device such as a touchscreen monitor. An Android or iOS application is downloadable on a standard touchscreen device. The application is easily configured to perform multiple function including, without limitation: (1) articulation controls to adjust the viewing angle and height of the display device, (2) power use and status monitoring, (3) programmable alarms for battery use and performance parameters, (4) programmable power on and off based on battery and inverter status, (5) battery life, half-life, performance, etc., and (6) presets for all parameters of the display device, battery, viewing angle and height, shutdown, charging, etc. A preferred embodiment of system 100 includes all of the above functionality.

Figure 6:
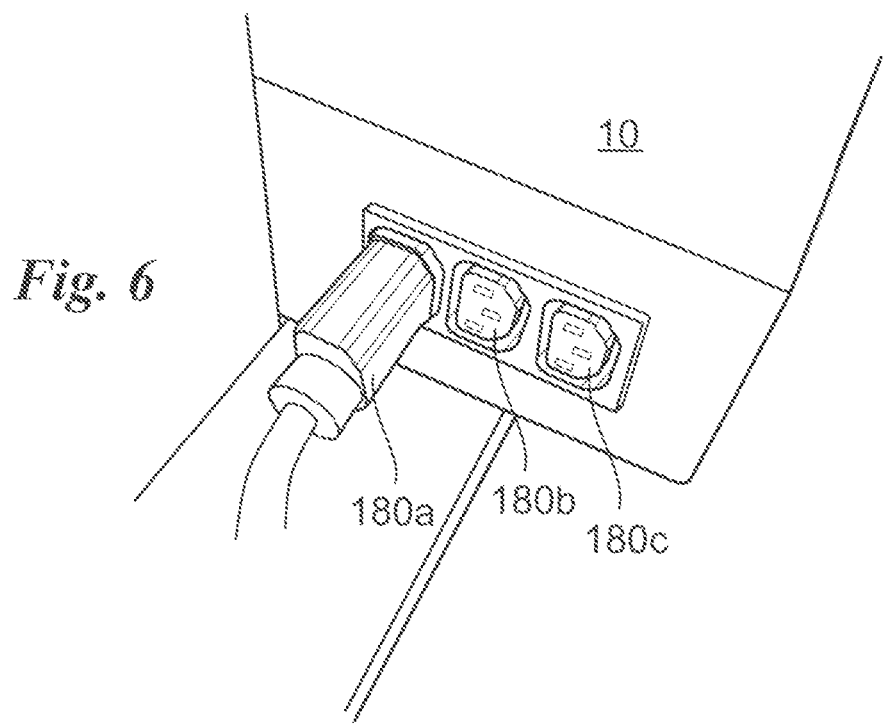
FIG. 6 is an illustration of the non-standard power outlets in a mobile powered display device stand system according to a preferred embodiment of the invention.

Referring now to FIG. 6, the non-standard power outputs 180a, 180b, and 180c of base 10 are illustrated. Standard power receptacles could be provided but testing revealed that often third parties would connect their devices to base 10 and drain power quickly. To prevent unwanted use of the power stored in base 10, non-standard power outputs are preferable.

The invention has been described with reference to the preferred embodiments without limit thereto. Additional embodiments and improvements may be realized which are not specifically set forth herein but which are within the scope of the invention as more specifically set forth in the claims appended hereto.

The invention claimed is:

1. A powered mobile display device stand, comprising:
   a base, comprising:
     a base cover over said base;
     a multiplicity of wheels affixed to the bottom of said base so as to provide mobility for said base;
     a communications port and cable for accepting input from a peripheral device and providing said input to a display device;
     a power supply inside said base and under said base cover, whereby a center of gravity of said base is positioned below said base cover, comprising:
       a battery,
       an inverter,
       a charger,
       a power outlet for providing power, and
       a power inlet for charging said battery;
   an adjustable neck affixed to the top of said base cover above the center of gravity of said base and extending vertically upward therefrom; and
   a substantially flat plate affixed to the top of said adjustable neck for attaching a display device.

2. The system of claim 1, wherein said substantially flat plate is affixed to said adjustable neck by means of an articulating hinge so as to allow an adjustable viewing angle for said display device.

3. The system of claim 1, wherein said adjustable neck articulates upwards and downwards so as to allow an adjustable viewing height for said display device.

4. The system of claim 1 further comprising a processor adapted to monitor said battery so as to provide a display output indicating a status of said battery.

5. The system of claim 1 further comprising an additional said power outlet for providing power to a peripheral device.

6. The system of claim 1, wherein said power outlet for providing power is a non-standard power outlet so as to prevent unwanted use of the system.

7. A method of using a powered mobile display device stand comprising:
   providing a base comprising therein:
   a multiplicity of wheels affixed to the bottom of said base so as to provide mobility for said base;
   a communications port and cable for communicating between a peripheral device and a display device;
     a power supply inside said base and under a base cover, whereby a center of gravity of said base is positioned below said base cover, comprising:
       a battery,
       an inverter,
       a charger,
       a power outlet for providing power, and
       a power inlet for charging said battery;
   providing an adjustable neck affixed to the top of said base above the center of gravity of said base housing and extending vertically upward therefrom;
   providing a substantially flat plate affixed to the top of said adjustable neck for attaching a display device; and
   attaching a display device to said substantially flat plate.

8. The method of claim 7, wherein said substantially flat plate is affixed to said adjustable neck by means of an articulating hinge so as to allow an adjustable viewing angle for said display device.

9. The method of claim 7, wherein said adjustable neck articulates upwards and downwards so as to allow an adjustable viewing height for said display device.

10. The method of claim 7, wherein said housing further comprises a processor adapted to monitor said battery so as to provide a display output indicating a status of said battery.

11. The method of claim 7, wherein said housing further comprises an additional said power outlet for providing power to a peripheral device.

12. The method of claim 7, wherein said power outlet for providing power is a non-standard power outlet so as to prevent unwanted use of the system.

13. A non-transitory computer readable medium encoded with a computer program comprising instructions that when executed by one or more processors cause the one or more processors to perform operations comprising:
   providing status information of one of a multiplicity of controllable parameters in a powered mobile display device stand, comprising a base, comprising therein:

a multiplicity of wheels affixed to the bottom of said base so as to provide mobility for said base;

a communications port and cable for accepting input from a peripheral device and providing said input to a display device;

a power supply inside said base and under a base cover, whereby a center of gravity of said base is positioned below said base cover, comprising:

a battery;

an inverter;

a charger;

a power outlet for providing power, and a power inlet for charging said battery;

an adjustable neck affixed to the top of said base cover above the center of gravity of said base and extending vertically upward therefrom; and a substantially flat plate affixed to the top of said adjustable neck for attaching a display device.

\* \* \* \* \*